(12) United States Patent
Lee et al.

(10) Patent No.: US 10,483,361 B1
(45) Date of Patent: Nov. 19, 2019

(54) WRAP-AROUND-CONTACT STRUCTURE FOR TOP SOURCE/DRAIN IN VERTICAL FETS

(71) Applicant: INTERNATIONAL BUSINESS MACHINES CORPORATION, Armonk, NY (US)

(72) Inventors: Choonghyun Lee, Rensselaer, NY (US); Christopher J. Waskiewicz, Rexford, NY (US); Alexander Reznicek, Troy, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/115,955

(22) Filed: Aug. 29, 2018

(51) Int. Cl.
*H01L 29/66* (2006.01)
*H01L 29/417* (2006.01)
(Continued)

(52) U.S. Cl.
CPC .......... *H01L 29/41741* (2013.01); *H01L 21/823418* (2013.01); *H01L 21/823437* (2013.01); *H01L 21/823475* (2013.01); *H01L 21/823487* (2013.01); *H01L 27/088* (2013.01); *H01L 29/0847* (2013.01); *H01L 29/45* (2013.01); *H01L 29/665* (2013.01); *H01L 29/6656* (2013.01); *H01L 29/66666* (2013.01); *H01L 29/7827* (2013.01); *H01L 21/0217* (2013.01); *H01L 21/0228* (2013.01);
(Continued)

(58) Field of Classification Search
CPC ......... H01L 21/823431; H01L 29/6653; H01L 21/76816
See application file for complete search history.

(56) References Cited

U.S. PATENT DOCUMENTS

| 7,385,258 B2 | 6/2008 | Zhu et al. |
| 9,299,835 B1 | 3/2016 | Anderson et al. |
(Continued)

OTHER PUBLICATIONS

Breil et al., "Highly-selective superconformal CVD Ti silicide process enabling area-enhanced contacts for next-generation CMOS architectures", 2017 Symposium on FLSI Technology Digest of Technical Papers. Jun. 5-8, 2017. pp. T216-T217.
(Continued)

*Primary Examiner* — Thomas L Dickey
(74) *Attorney, Agent, or Firm* — Tutunjian & Bitetto, P.C.; L. Jeffrey Kelly

(57) ABSTRACT

A method is presented for forming a wrap-around-contact. The method includes forming a bottom source/drain region adjacent a plurality of fins, disposing encapsulation layers over the plurality of fins, recessing at least one of the encapsulation layers to expose top portions of the plurality of fins, and for forming top spacers adjacent the top portions of the plurality of fins. The method further includes disposing a sacrificial liner adjacent the encapsulation layers, recessing the top spacers, forming top source/drain regions over the top portions of the plurality of fins, removing the sacrificial liner to create trenches adjacent the top source/drain regions, and depositing a metal liner within the trenches and over the top source/drain regions such that the wrap-around-contact is defined to cover an upper area of the top source/drain regions.

15 Claims, 10 Drawing Sheets

(51) Int. Cl.
  *H01L 21/8234* (2006.01)
  *H01L 29/08* (2006.01)
  *H01L 29/45* (2006.01)
  *H01L 27/088* (2006.01)
  *H01L 29/78* (2006.01)
  *H01L 21/306* (2006.01)
  *H01L 21/3065* (2006.01)
  *H01L 21/02* (2006.01)
  *H01L 21/311* (2006.01)
  *H01L 29/51* (2006.01)
  *H01L 29/49* (2006.01)
  *H01L 21/28* (2006.01)
  *H01L 21/3105* (2006.01)
  *H01L 21/321* (2006.01)

(52) U.S. Cl.
  CPC .. *H01L 21/02181* (2013.01); *H01L 21/02271* (2013.01); *H01L 21/02532* (2013.01); *H01L 21/02609* (2013.01); *H01L 21/28088* (2013.01); *H01L 21/3065* (2013.01); *H01L 21/30604* (2013.01); *H01L 21/31053* (2013.01); *H01L 21/31116* (2013.01); *H01L 21/3212* (2013.01); *H01L 29/4966* (2013.01); *H01L 29/517* (2013.01)

(56) References Cited

U.S. PATENT DOCUMENTS

| | | | |
|---|---|---|---|
| 9,318,581 | B1 | 4/2016 | Guo et al. |
| 9,443,769 | B2 | 9/2016 | Wang et al. |
| 9,735,253 | B1 | 8/2017 | Bi et al. |
| 9,876,094 | B2 | 1/2018 | Bae et al. |
| 2008/0079090 | A1 | 4/2008 | Hwang et al. |
| 2011/0147840 | A1 | 6/2011 | Cea et al. |
| 2015/0255604 | A1 | 9/2015 | Yang |
| 2016/0351671 | A1* | 12/2016 | Yang .................. H01L 29/7848 |
| 2018/0061967 | A1* | 3/2018 | Bi .................... H01L 29/66666 |

OTHER PUBLICATIONS

Yu et al., "TiSi(Ge) Contacts Formed at Low Temperature Achieving Around 2 x 10-9 Ωcm2 Contact Resistivities to o-SiGe", IEEE Transactions on Electron Devices. vol. 64. No. 2. Feb. 2017. pp. 500-506.

* cited by examiner

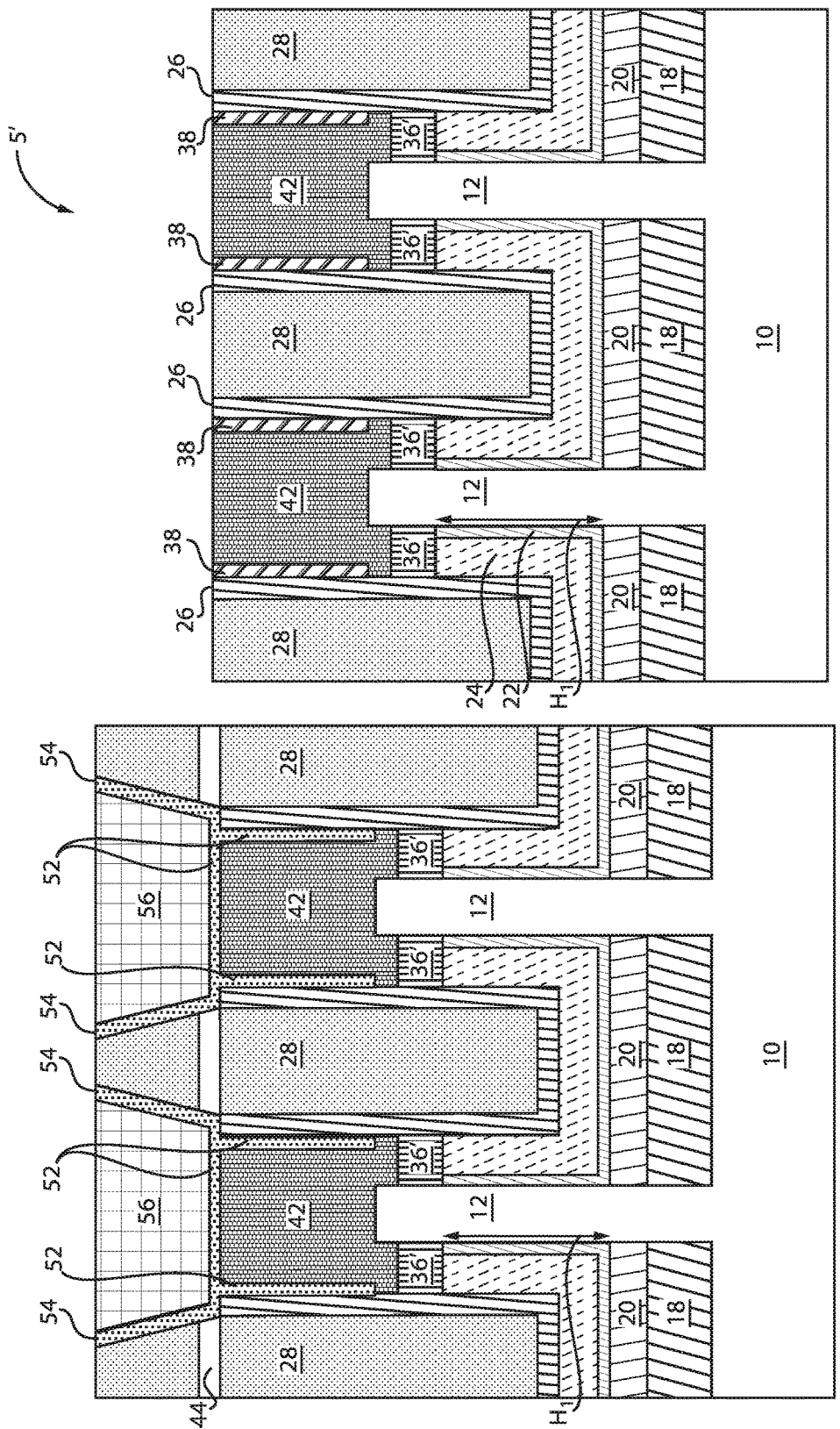

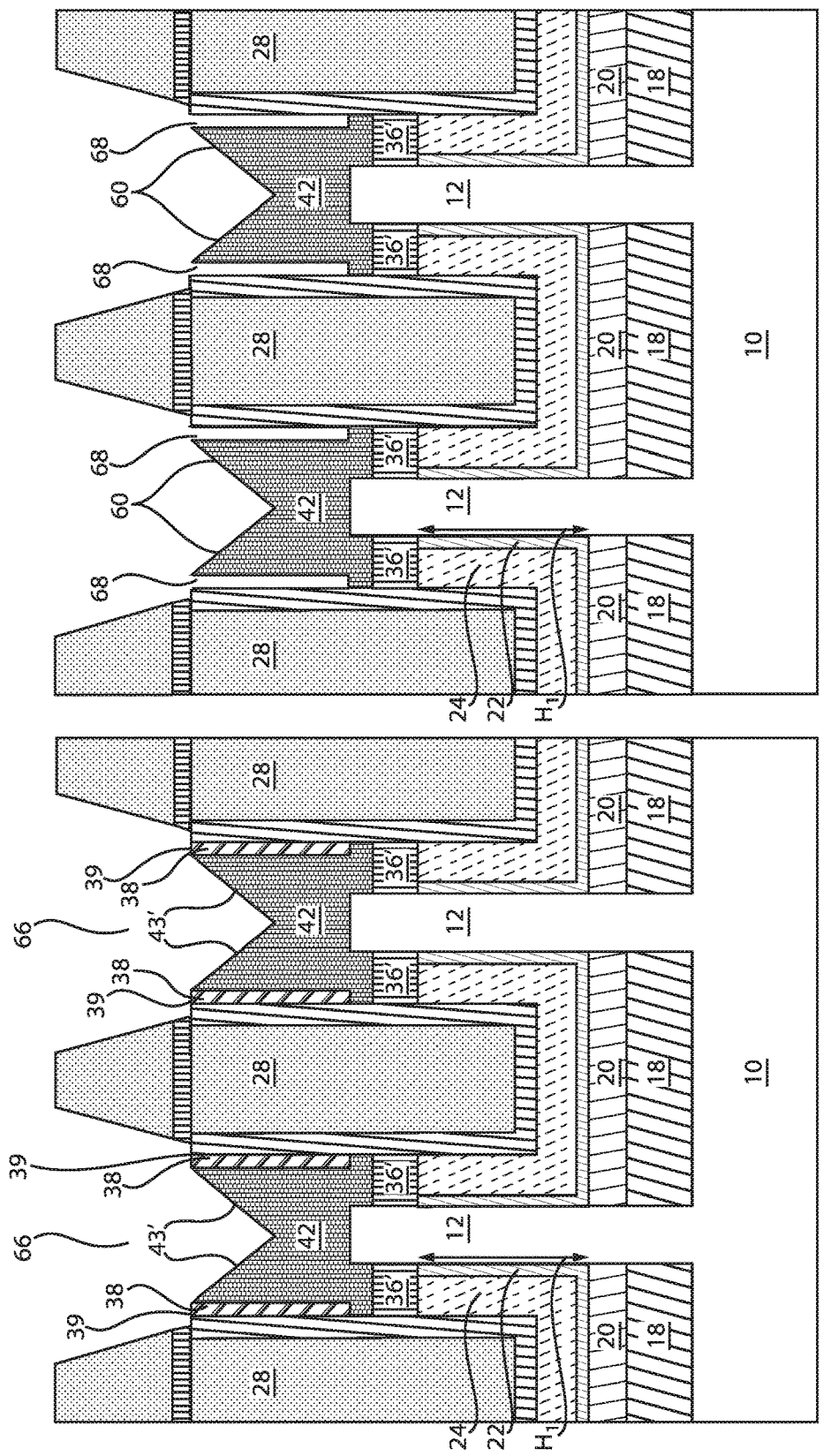

WRAP-AROUND-CONTACT STRUCTURE FOR TOP SOURCE/DRAIN IN VERTICAL FETS

BACKGROUND

Technical Field

The present invention relates generally to semiconductor devices, and more specifically, to forming a wrap-around-contact (WAC) for top source/drain regions in vertical field effect transistors (FETs).

Description of the Related Art

In recent years, with increases in the degree of integration, functionality, and speed of semiconductor devices, there is an increasing demand for miniaturization of semiconductor devices. To meet the demand, various device structures have been proposed for reducing an area occupied by transistors over a substrate. Among them, a field effect transistor (FET) having a fin-type structure (FinFET) has drawn attention. FinFETs are three-dimensional structures that rise above the substrate and resemble a fin. It is desirable to have improvements in the fabrication of FinFET transistors to improve quality of transistor contacts.

SUMMARY

In accordance with an embodiment, a method is provided for forming a wrap-around-contact. The method includes forming a bottom source/drain region adjacent a plurality of fins, disposing encapsulation layers over the plurality of fins, recessing at least one of the encapsulation layers to expose top portions of the plurality of fins, and forming top spacers adjacent the top portions of the plurality of fins. The method further includes disposing a sacrificial liner adjacent the encapsulation layers, recessing the top spacers, forming top source/drain regions over the top portions of the plurality of fins, removing the sacrificial liner to create trenches adjacent the top source/drain regions, and depositing a metal liner within the trenches and over the top source/drain regions such that the wrap-around-contact is defined to cover an upper area of the top source/drain regions.

In accordance with another embodiment, a method is provided for forming a wrap-around-contact. The method includes forming a bottom source/drain region adjacent a plurality of fins, depositing a high-k layer and a work function metal (WFM) layer over the plurality of fins, disposing encapsulation layers over the WFM layer, recessing the encapsulation layers to expose top portions of the plurality of fins, and forming top spacers adjacent the top portions of the plurality of fins. The method further includes disposing a sacrificial liner adjacent the encapsulation layers, recessing the top spacers, forming top source/drain regions over the top portions of the plurality of fins, forming V-shaped grooves in the top source/drain regions, removing the sacrificial liner to create trenches adjacent the top source/drain regions, and depositing a metal liner within the trenches and over the V-shaped grooves of the top source/drain regions such that the wrap-around-contact is defined to cover an upper area of the top source/drain regions.

In accordance with yet another embodiment, a semiconductor structure is provided for forming a wrap-around-contact. The semiconductor structure includes a bottom source/drain region disposed adjacent a plurality of fins, a high-k layer and a work function metal (WFM) layer disposed adjacent the plurality of fins, top spacers disposed adjacent top portions of the plurality of fins, top source/drain regions disposed over the top portions of the plurality of fins, and a metal liner disposed adjacent and over the top source/drain regions such that the wrap-around contact is defined to cover an upper area of the top source/drain regions.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 13 is a cross-sectional view of the semiconductor structure of FIG. 12 where metallization of the top/source drain regions takes place, in accordance with an embodiment of the present invention;

FIG. 14 is a cross-sectional view of a semiconductor structure where top source/drain regions are formed over the plurality of fins, in accordance with another embodiment of the present invention;

FIG. 17 is a cross-sectional view of a semiconductor structure of FIG. 16 where the ILD is etched to expose a top surface of the V-grooved formations of the top source/drain regions, in accordance with an embodiment of the present invention;

FIG. 18 is a cross-sectional view of a semiconductor structure of FIG. 17 where the sacrificial liner is removed, in accordance with an embodiment of the present invention.

Throughout the drawings, same or similar reference numerals represent the same or similar elements.

DETAILED DESCRIPTION

Figure 1:
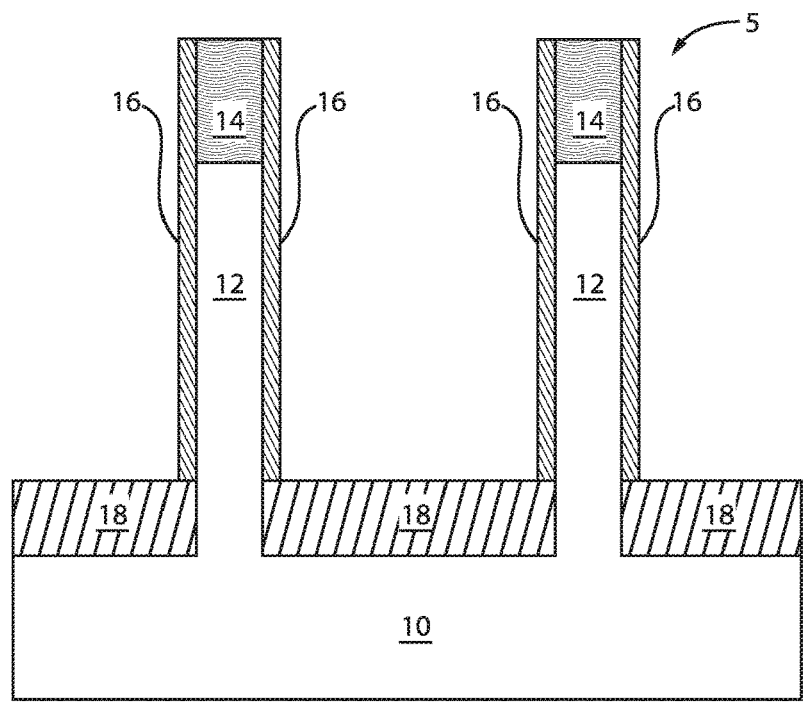
FIG. 1 is a cross-sectional view of a semiconductor structure including a plurality of fins and bottom source/drain regions formed over a semiconductor substrate, in accordance with an embodiment of the present invention.

Embodiments in accordance with the present invention provide methods and devices for forming vertical field effect transistor (FET) devices with reduced contact resistance. Vertical FET devices employ doped source and drain regions, where a doped source/drain region for a vertical FET can be formed on top of a vertical semiconductor fin, and where a doped source/drain region can be formed underneath the vertical semiconductor fin. In addition, a vertical source/drain (S/D) contact of the vertical FET device can be disposed adjacent to the vertical semiconductor fin as an elongated bar contact. The vertical S/D contact can be formed to make contact to an upper surface of the underlying S/D region, and can be disposed at a sufficient distance from the vertical semiconductor fin so that the vertical S/D contact does not electrically short to the vertical metal gate structure formed on the vertical semiconductor fin. What this effectively means is that the current path through the doped S/D region between a vertical contact/S/D region interface and a S/D region/channel junction interface, can be constructed entirely of doped semiconductor material. This current path through the doped S/D region, if relatively long, can result in increased series resistance of the S/D, which in turn reduces a total drive current of the vertical FET device.

Thus, contact resistance dominates as transistor device scaling continues beyond the 10 nanometer (nm) technology node. The term contact resistance is the contribution to the total resistance of a material in which total resistance comes from the electrical leads and connections, as opposed to the intrinsic resistance that is an inherent property independent of the measurement method. Contact resistivity (RhoC) reduction alone is not enough to reduce external resistance to the target for the 10 nm technology node and beyond, and a new contact structure is needed to increase contact area.

Embodiments in accordance with the present invention provide methods and devices employing techniques for fabricating or constructing wrap-around metal liners to increase contact area, and, thus, reduce contact resistance. The exemplary embodiments further increase the metal contact area on the top S/D region rather than engineering the bottom S/D contact. The exemplary embodiments provide a wrap-around liner contact on the top S/D regions of vertical FETs to reduce the external resistance at the top S/D. As a result, the exemplary methods can be manufactured using 10 nm technology and beyond.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a plurality of fins and bottom source/drain regions formed over a semiconductor substrate, in accordance with an embodiment of the present invention.

The semiconductor structure 5 includes a substrate 10 and a plurality of fins 12 formed thereon. Each fin 12 includes a hardmask 14 on a top surface thereof, as well as dielectric liners 16 formed on sidewalls thereof. A bottom portion of the dielectric liners 16 is then recessed, and a top section of the substrate 10 is modified to form bottom source/drain regions 18 between the plurality of fins 12.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials.

The plurality of fins 12 are formed from a semiconductor material including, but not limited to, Si, strained Si, SiC, SiGe, SiGeC, Si alloys, Ge, Ge alloys, GaAs, InAs, InP, as well as other III/V and II/VI compound semiconductors. The plurality of fins 12 can be etched by employing, e.g., a reactive ion etch (RIE) or the like. In other embodiments, the etching can include a dry etching process such as, for example, reactive ion etching, plasma etching, ion etching or laser ablation. The etching can further include a wet chemical etching process in which one or more chemical etchants are employed to remove portions of the layers.

The plurality of fins 12 can be, e.g., silicon (Si) fins. In another exemplary embodiment, the plurality of fins 12 can be, e.g., silicon germanium (SiGe) fins. Yet in another exemplary embodiment, some of fins 12 can be a material that is different from the other fins. For example, some fins can be silicon fins while others can be silicon germanium (SiGe) fins. One skilled in the art can contemplate forming fins 12 from any type of materials.

The hardmask 14 can be manufactured of silicon nitride (SiN), deposited using, for example, low pressure chemical vapor deposition (LPCVD). In other example embodiments, the hardmask 14 can include, but is not limited to, hafnium oxide ($HfO_2$) or tantalum nitride (TaN) or titanium nitride (TiN). In some embodiments, the hardmask 14 can include multiple layers, for example, silicon nitride on top of silicon oxide. In some embodiments, the vertical thickness of the hardmask 14 ranges from about 30 nm to about 150 nm. The hardmask 14 can be formed by any suitable patterning technique, including but not limited to, sidewall image transfer (SIT), self-aligned double patterning (SADP), self-aligned quadruple patterning (SAQP), lithography followed by etching, etc.

Spacers or liners 16 are shown formed adjacent the plurality of fins 12. The spacers or liners 16 can be formed by first providing a spacer material and then etching the spacer material. The spacer material can include any dielectric spacer material including, for example, a dielectric oxide, dielectric nitride, and/or dielectric oxynitride. In one example, the spacer material can include silicon oxide or silicon nitride (SiN). The spacer material can be provided by a deposition process including, for example, chemical vapor deposition (CVD), plasma enhanced chemical vapor deposition (PECVD), or physical vapor deposition (PVD). The etching of the spacer material can include a dry etch process such as, for example, a reactive ion etch (RIE). In some embodiments, the liners 16 have a thickness within the range of about 2-10 nm.

Bottom source/drain regions 18 can be epitaxially grown over the substrate 10. Source/drain regions 18 can be, e.g., Si:P for an nFET and SiGe:B for a pFET. It is to be understood that the term "source/drain region" as used herein means that a given source/drain region can be either a source region or a drain region, depending on the application.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 2:
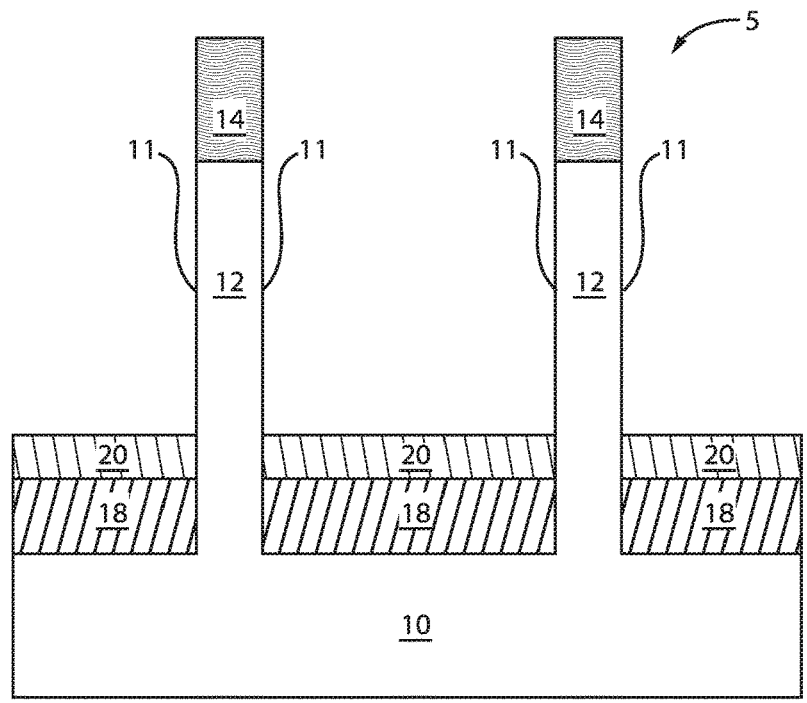
FIG. 2 is a cross-sectional view of the semiconductor structure of FIG. 1 where a bottom spacer is formed over the bottom source/drain regions, in accordance with an embodiment of the present invention.

FIG. 2 is a cross-sectional view of the semiconductor structure of FIG. 1 where a bottom spacer is formed over the bottom source/drain regions, in accordance with an embodiment of the present invention.

In various exemplary embodiments, the dielectric liners 16 are removed and bottom spacers 20 are formed over the bottom source/drain regions 18. The removal of dielectric liners 16 results in the exposure of sidewalls 11 of the fins 12. Bottom spacers 20 can include a low-k dielectric formed according to known processes. The term "low-k dielectric" generally refers to an insulating material having a dielectric constant less than silicon dioxide, e.g., less than 3.9. Exemplary low-k dielectric materials include, but are not limited to, dielectric nitrides (e.g., SiN, SiBCN), dielectric oxynitrides (e.g., SiOCN, SiCO), or any combination thereof or the like.

Figure 3:
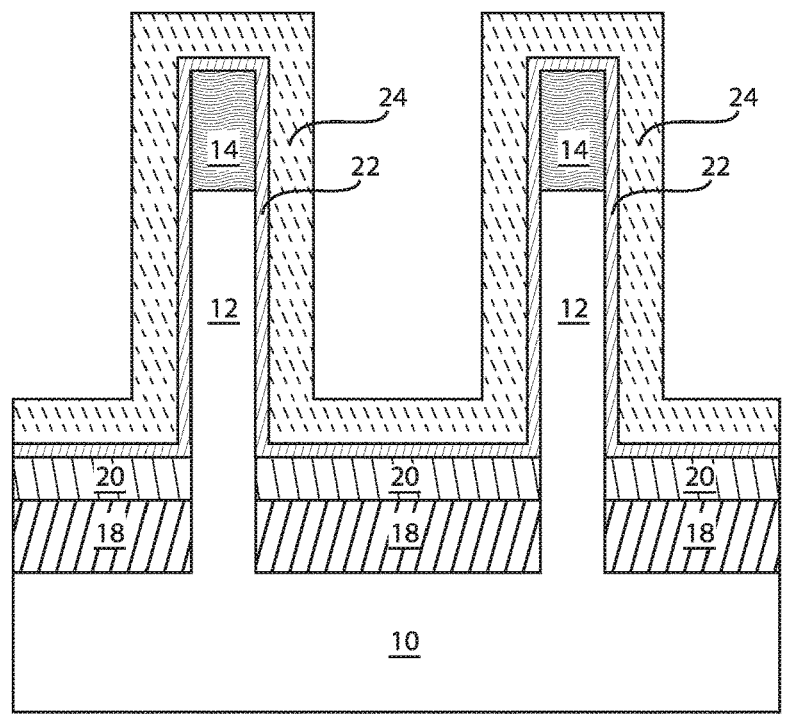
FIG. 3 is a cross-sectional view of the semiconductor structure of FIG. 2 where a high-k layer and a work function metal (WFM) layer are deposited, in accordance with an embodiment of the present invention.

FIG. 3 is a cross-sectional view of the semiconductor structure of FIG. 2 where a high-k layer and a work function metal (WFM) layer are deposited, in accordance with an embodiment of the present invention.

In various exemplary embodiments, a high-k layer 22 and a work function metal layer 24 are deposited. The high-k layer 22 can include a hafnium oxide ($HfO_2$) layer deposited to a thickness of approximately 2 nm. High-k layer 22 can be formed using ALD, which involves the deposition of successive monolayers over a substrate within a deposition chamber usually maintained at sub-atmospheric pressure. Furthermore, it will be appreciated that "high-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, $HfO_2$, $ZrO_2$, $Al_2O_3$, $TiO_2$, $Ta_2O_5$, lanthanide oxides and mixtures thereof, silicates and materials such as YSZ (yttria-stabilized zirconia), BST, BT, ST, and SBT.

WFM layer 24 can be selectively grown over high-k layer 22 and can include aluminum (Al) or an aluminum/titanium (Al/Ti) multilayer stack, where the Al/Ti thickness can be tuned for target composition ratio to achieve the desired work function. Both Al and Ti could be selectively grown. In other exemplary embodiments, the WFM layer 24 can be, e.g., TiN, TiAlC, TaN, etc.

Therefore, a high-k material 22 can be formed on the intermediate structure, followed by formation of a work function metal (WFM) layer 24 according to one polarity device (for example nFET or pFET) on the wafer and according to another polarity device (for example nFET or pFET). It is appreciated that an nFET uses one type of WFM and a pFET uses another type of WFM. In one example, the WFM layer 24 can be TiN for a pFET, and the WFM layer 24 can be Al-doped TiN or TaN, etc., for an nFET.

Figure 4:
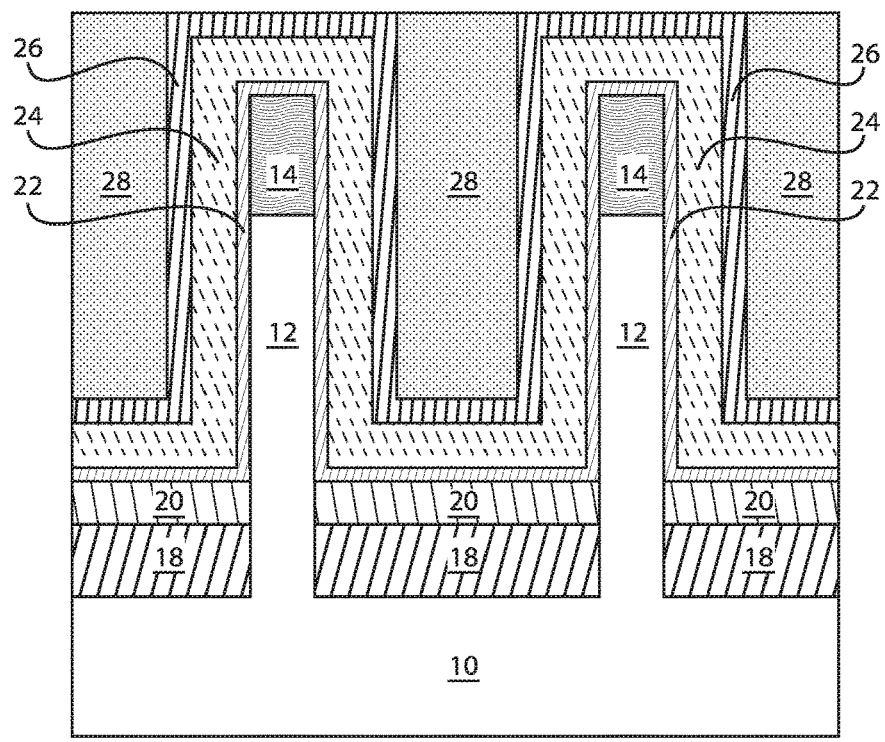
FIG. 4 is a cross-sectional view of the semiconductor structure of FIG. 3 where gate encapsulation takes place, in accordance with an embodiment of the present invention.

FIG. 4 is a cross-sectional view of the semiconductor structure of FIG. 3 where gate encapsulation takes place, in accordance with an embodiment of the present invention.

In various exemplary embodiments, gate encapsulation can occur. Gate encapsulation can include deposition of a first gate encapsulation layer 26 and a second gate encapsulation layer 28. The first gate encapsulation layer 26 can be a nitride, such as, e.g., SiN or SiBCN. The second gate encapsulation layer 28 can be an oxide, such as, e.g., SiO$_2$.

The second gate encapsulation layer 28 can be planarized. The planarizing process can include chemical mechanical polishing (CMP) followed by an etch process. Thus, the planarization process can be provided by CMP. Other planarization processes can include grinding and polishing.

Figure 5:
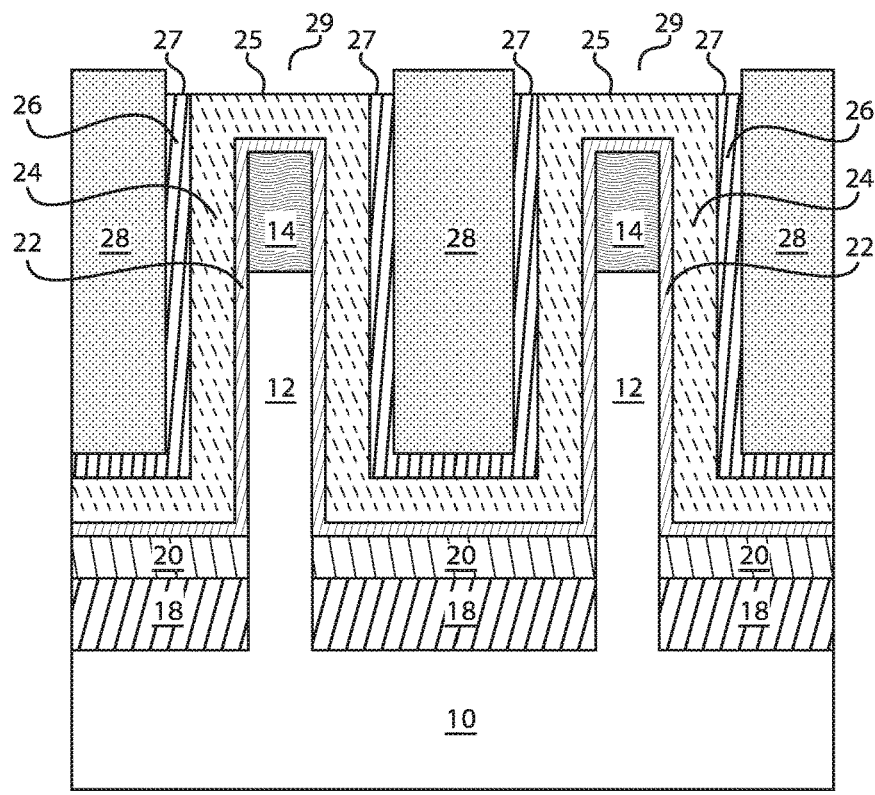
FIG. 5 is a cross-sectional view of the semiconductor structure of FIG. 4 where a dielectric liner formed over the gate encapsulation is selectively etched to expose a top surface of the WFM, in accordance with an embodiment of the present invention.

FIG. 5 is a cross-sectional view of the semiconductor structure of FIG. 4 where a dielectric liner formed over the gate encapsulation is selectively etched to expose a top surface of the WFM, in accordance with an embodiment of the present invention.

In various exemplary embodiments, first gate encapsulation layer 26 is etched or recessed, e.g., by selective RIE, to create openings or trenches 29 to expose a top surface 25 of the WFM layer 24. Additionally, a top surface 27 of the first gate encapsulation layer 26 on the sidewalls of the WFM layer 24 is exposed.

Figure 6:
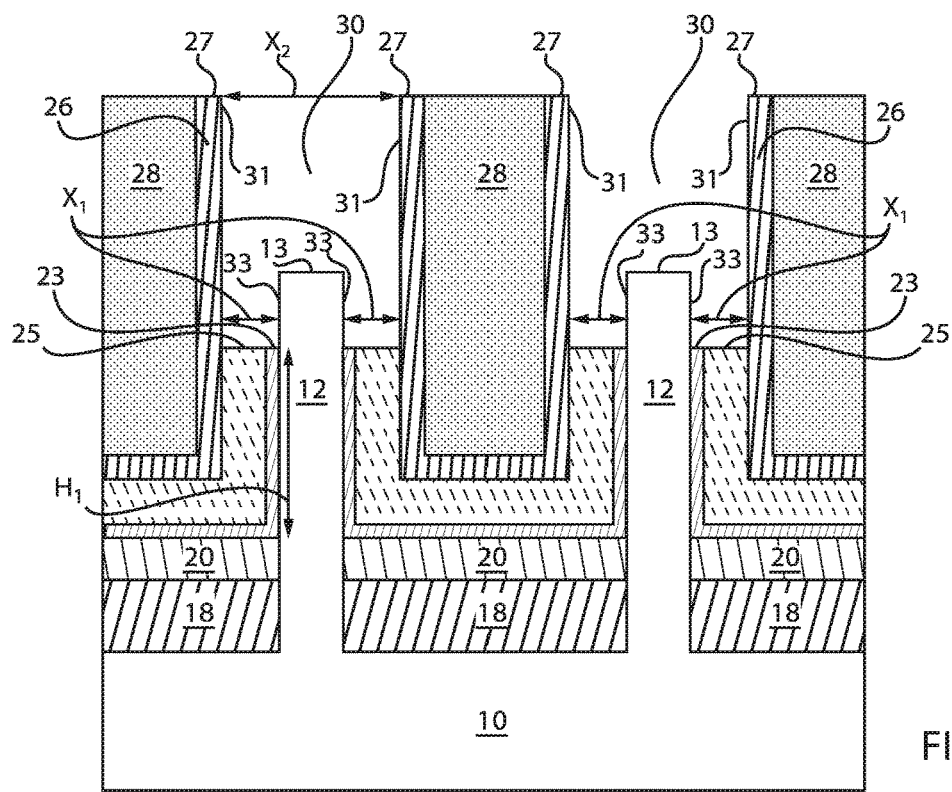
FIG. 6 is a cross-sectional view of the semiconductor structure of FIG. 5 where the high-k/WFM is selectively etched to expose a top portion of the plurality of fins, in accordance with an embodiment of the present invention.

FIG. 6 is a cross-sectional view of the semiconductor structure of FIG. 5 where the high-k/WFM is selectively etched to expose a top portion of the plurality of fins, in accordance with an embodiment of the present invention.

In various exemplary embodiments, the high-k material 22 and the WFM layer 24, are etched back until they are recessed below the height of the fins 12 in the z-axis. This results in the removal of the hardmask 14. The high-k material 22 and the WFM layer 24 can have a height "H$_1$." Recessing the layers 22, 24 can be performed by wet etch processing, and results in trenches 30. In one example, a vertical wet etch can be employed to define the channel length. Non-limiting examples of wet etch processes that can be used to form the recess include hydrogen peroxide (H2O2), potassium hydroxide (KOH), ammonium hydroxide (ammonia), tetramethylammonium hydroxide (TMAH), hydrazine, or ethylene diamine pyrocatechol (EDP), or any combination thereof.

The etch back results in exposure of a top surface 13 of the fins 12, as well as sidewalls 33 of the fins 12. Additionally, a top surface 25 of the WFM layer 24 and a top surface 23 of the high-k material 22 are exposed. The sidewalls 31 of the first gate encapsulation layer 26 are also exposed. In one example, the width (X$_2$) of the trenches 30 can be about 30 nm, whereas the width (X$_1$) of the high-k material 22 and the WFM layer 24 combined can be about 10 nm.

Figure 7:
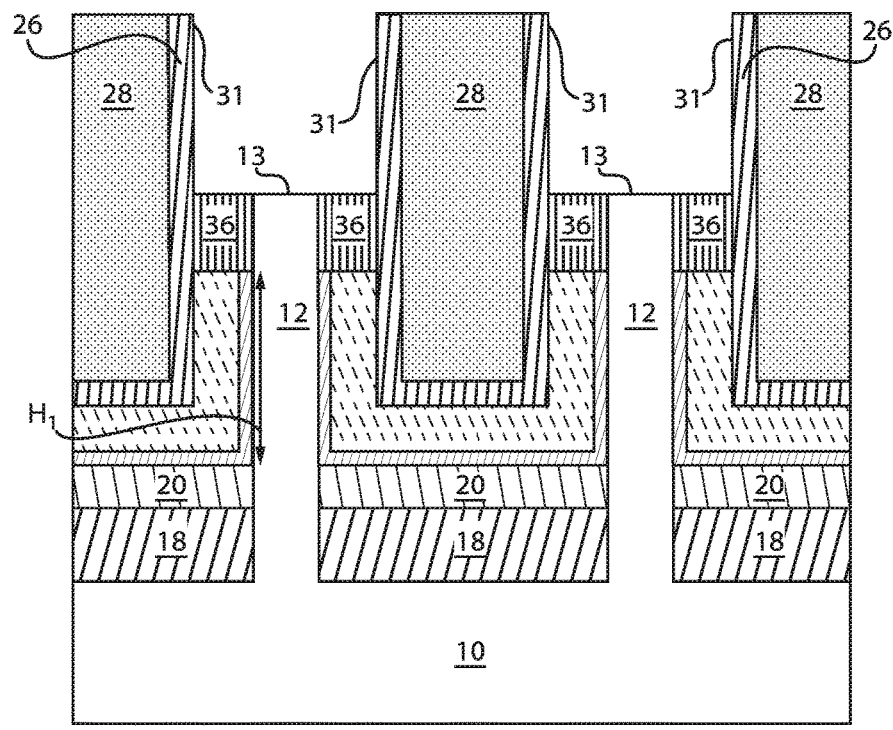
FIG. 7 is a cross-sectional view of the semiconductor structure of FIG. 6 where a top spacer is formed, in accordance with an embodiment of the present invention.

FIG. 7 is a cross-sectional view of the semiconductor structure of FIG. 6 where a top spacer is formed, in accordance with an embodiment of the present invention.

In various exemplary embodiments, top spacers 36 are formed. Top spacer material 36 can be formed over the top surfaces 23, 25 of the high-k material 22 and the WFM layer 24, respectively. Examples of top spacer material 36 can include oxides and nitrides (such as, e.g., SiN, SiBCN, SiOCN). The top spacer material 36 can be a low-k dielectric material. In one implementation, the top spacer material 36 can be formed with techniques analogous to forming the bottom spacer material 20. The top spacer material 36 can be thicker than the bottom spacer material 20.

Figure 8:
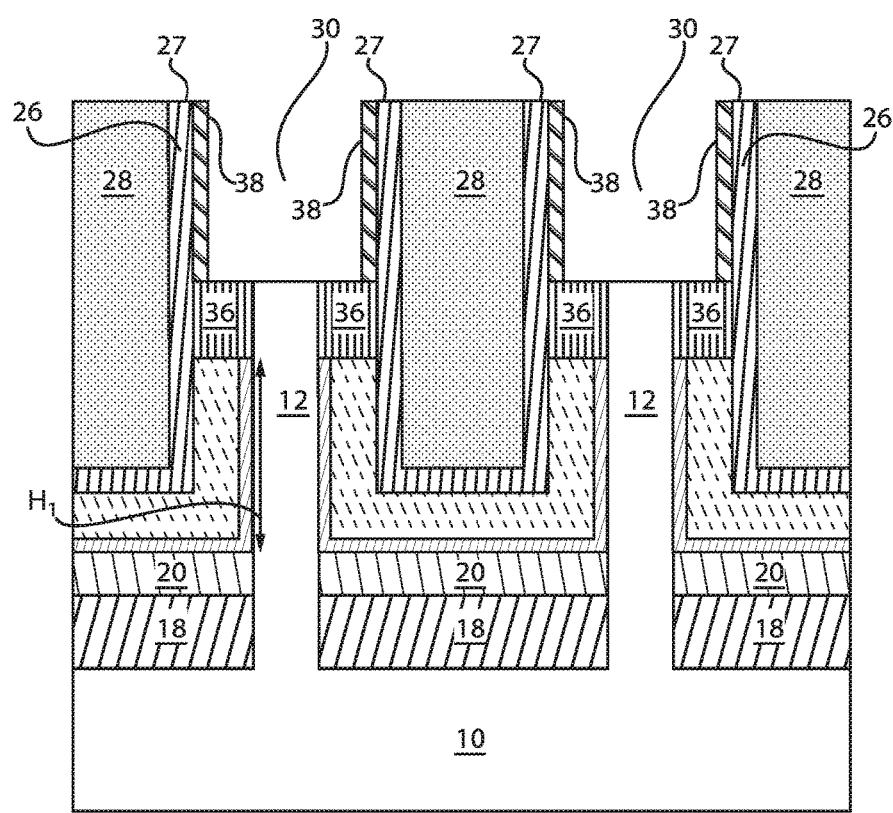
FIG. 8 is a cross-sectional view of the semiconductor structure of FIG. 7 where a sacrificial liner is deposited over a portion of the top spacer, in accordance with an embodiment of the present invention.

FIG. 8 is a cross-sectional view of the semiconductor structure of FIG. 7 where a sacrificial liner is deposited over a portion of the top spacer, in accordance with an embodiment of the present invention.

In various exemplary embodiments, a conformal sacrificial dielectric liner 38 is deposited adjacent or in direct contact with the sidewalls 31 of the first gate encapsulation layer 26. The sacrificial dielectric liner 38 extends to a portion of a top surface of the top spacer material 36. The sacrificial liner 38 can include an oxide material. The oxide material 38 can be, e.g., SiO$_2$. The oxide material 38 can have a thickness of about 3-4 nm. The sacrificial liner 38 acts as a placeholder for the thin silicide metal liner 52 that will subsequently be deposited (FIG. 13).

Figure 9:
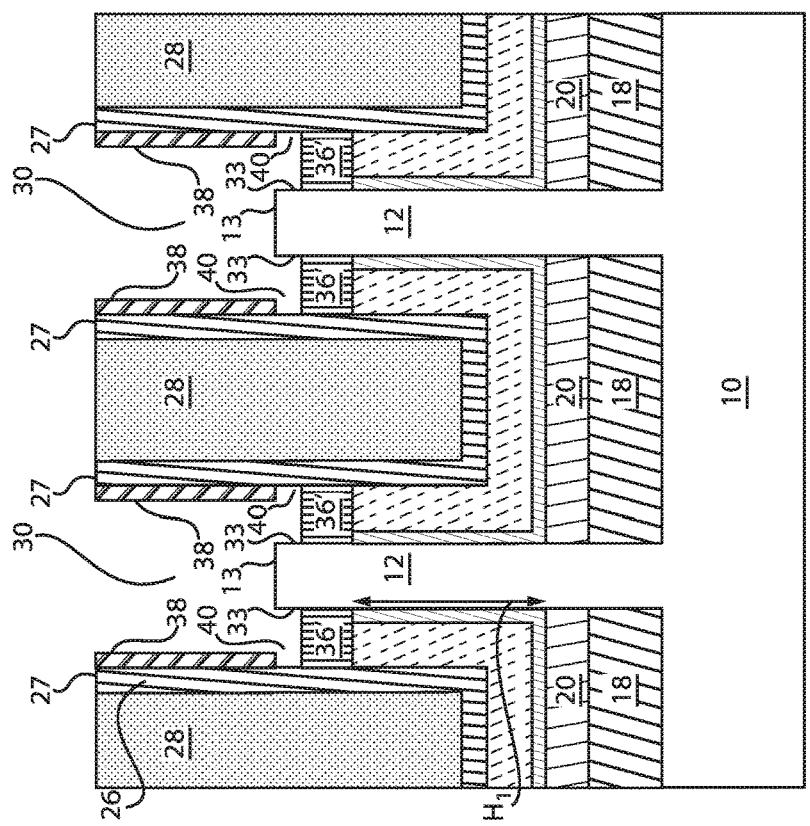
FIG. 9 is a cross-sectional view of the semiconductor structure of FIG. 8 where the top spacer is etched back to expose sidewalls of each of the plurality of fins, in accordance with an embodiment of the present invention.

FIG. 9 is a cross-sectional view of the semiconductor structure of FIG. 8 where the top spacer is etched back to expose sidewalls of each of the plurality of fins, in accordance with an embodiment of the present invention.

In various exemplary embodiments, the top spacer 36 is etched back such that top spacer portions 36' remain over the top surfaces 23, 25 of the high-k material 22 and the WFM layer 24, respectively. In one implementation, an isotropic RIE or wet etch can be used to etch the spacer material 36. The etch back of the top spacer 36 further results in the exposure of the top surface 13 of fins 12, as well as sidewalls 33 of fins 12. The etch back of the top spacer 36 further results in cavities 40 formed underneath the sacrificial liner 38, which remains intact.

Figure 10:
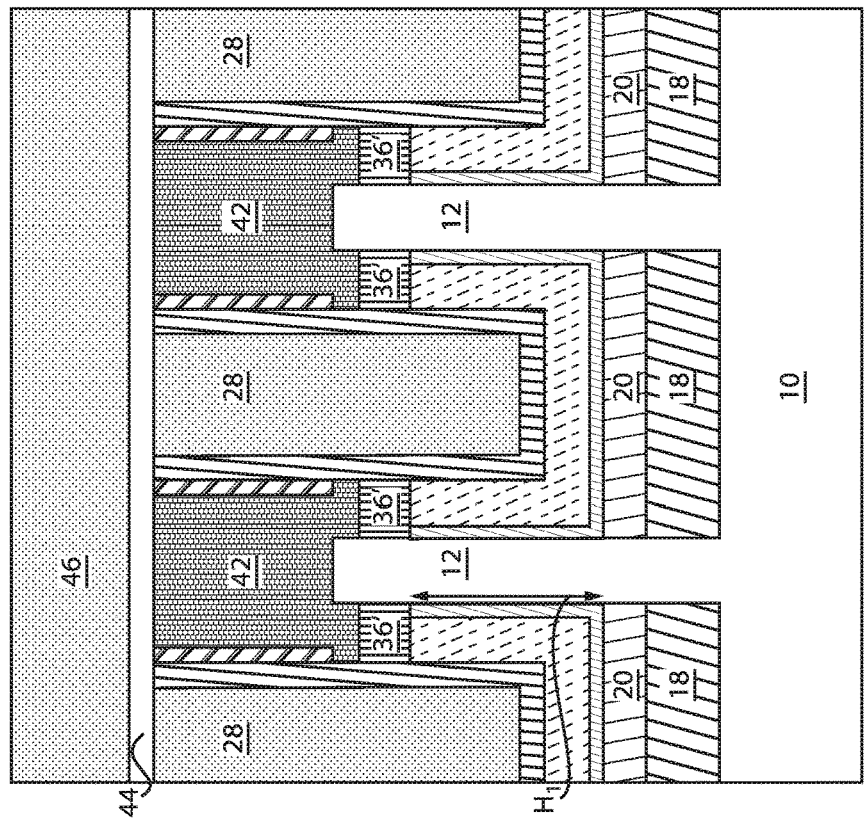
FIG. 10 is a cross-sectional view of the semiconductor structure of FIG. 9 where top source/drain regions are formed and an inter-layer dielectric (ILD) is deposited, in accordance with an embodiment of the present invention.

FIG. 10 is a cross-sectional view of the semiconductor structure of FIG. 9 where top source/drain regions are formed and an inter-layer dielectric (ILD) is deposited, in accordance with an embodiment of the present invention.

In various exemplary embodiments, top source/drain regions 42 are formed over the exposed top fin portions. A first dielectric layer 44 and a second dielectric layer 46 are then deposited over the structure. The first dielectric layer 44 can be, e.g., a SiN layer and the second dielectric layer 46 can be, e.g., an interlayer dielectric (ILD).

The ILD 46 can include any materials known in the art, such as, for example, porous silicates, carbon doped oxides, silicon dioxides, silicon nitrides, silicon oxynitrides, or other dielectric materials. The ILD 46 can be formed using any method known in the art, such as, for example, chemical vapor deposition, plasma enhanced chemical vapor deposition, atomic layer deposition, or physical vapor deposition. The ILD 46 can have a thickness ranging from about 25 nm to about 200 nm.

The dielectric material of layer 46 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The ILD layer 46 can be formed with any suitable insulating/dielectric materials such as, for example, silicon oxide, silicon nitride, hydrogenated silicon carbon oxide, silicon based low-k dielectrics, porous dielectrics, or organic dielectrics including porous organic dielectrics, etc.

In some embodiments, the dielectrics 44, 46 can include multiple materials. The dielectrics 44, 46 can be formed by any suitable processing technique, including but not limited to, thermal oxidation, chemical oxidation, thermal nitridation, plasma oxidation, plasma nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, spin-on-coating, ion beam deposition, electron beam deposition, laser assisted deposition, chemical solution deposition, or any combination of those methods.

Figures 11, 12:
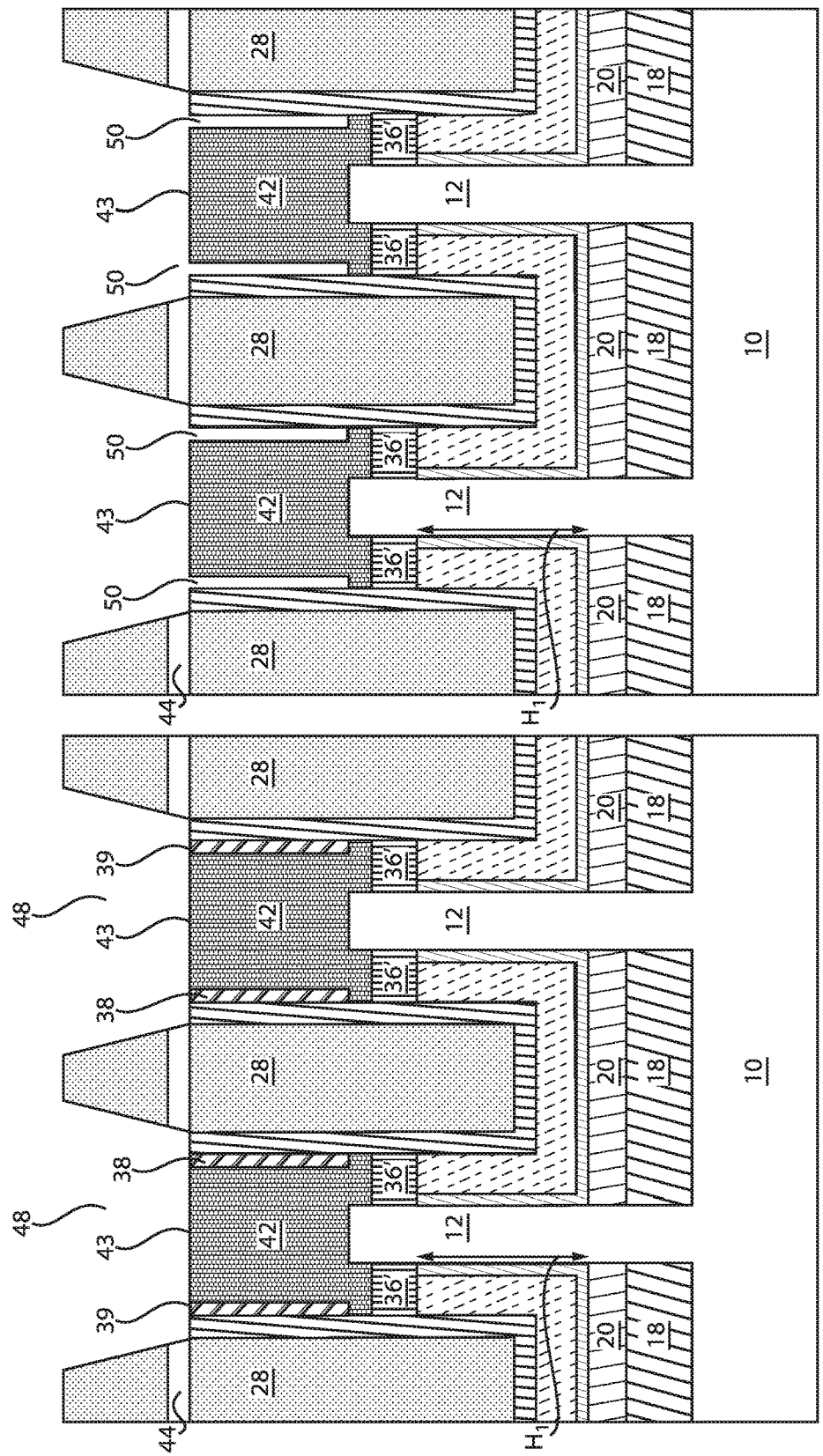
FIG. 11 is a cross-sectional view of the semiconductor structure of FIG. 10 where openings are created to the top surface of the top source/drain regions, in accordance with an embodiment of the present invention.
FIG. 12 is a cross-sectional view of the semiconductor structure of FIG. 11 where the sacrificial liner is removed, in accordance with an embodiment of the present invention.

FIG. 11 is a cross-sectional view of the semiconductor structure of FIG. 10 where openings are created to the top surface of the top source/drain regions, in accordance with an embodiment of the present invention.

In various exemplary embodiments, openings 48 are created to the top surface 43 of the top source/drain regions 42. The openings 48 also result in the exposure of the top surface 39 of the sacrificial liner 38.

FIG. 12 is a cross-sectional view of the semiconductor structure of FIG. 11 where the sacrificial liner is removed, in accordance with an embodiment of the present invention.

In various exemplary embodiments, the sacrificial liner 38 is removed, thus creating trenches or openings or cavities 50 extending along the sidewalls of the top source/drain regions 42. The cavities 50 do not extend to the top surface of the top spacer portions 36'.

FIG. 13 is a cross-sectional view of the semiconductor structure of FIG. 12 where metallization of the top/source drain regions takes place, in accordance with an embodiment of the present invention.

In various exemplary embodiments, metallization of the top/source drain regions takes place. The metallization includes forming metal layers 52 and metal layers 54. Metal layers 52 are defined vertically or in parallel to the fins 12 (where they fill the cavities 50), whereas top/bottom metal layer 52 is defined horizontally or perpendicular to the fins 12. The metal layers 52 collectively form a substantially inverted U-shaped metal layer over the top/source drain regions 42. The inverted U-shaped metal layer 52 wraps around the top/source drain regions 42. The inverted U-shaped metal layer 52 covers or surrounds or encapsulates or engulfs or encompasses or encloses a substantial portion of an upper area of the top/source drain regions 42. The inverted U-shaped metal layer 52 extends to a level or plane that is flush with the top surface of the fins 12. Additionally, metal layers 54 can be formed adjacent the second dielectric layer 46. The metal layers 54 and the bottom metal layer 52 can work in conjunction to receive a metal fill 56. The metal layers 54 and the bottom metal layer 52 can form another substantially U-shaped metal layer configuration (over the inverted U-shaped metal layer, with one surface or layer being common for both U-shaped configurations). In one exemplary embodiment, the metal layers 52, 54 can be, e.g., titanium/titanium nitride (Ti/TiN) layers or liners. In other exemplary embodiments, the metal layers 52, 54 can be formed from, e.g., Ti, TiN, Ni, etc. The metal layers 52, 54 can be deposited by, e.g., an ALD process. The metal layers 52, 54 can be referred to as thin silicide metal liners.

The metal fill 56 can be, e.g., tungsten (W) or cobalt (Co) with silicide metal liner such as titanium (Ti) and titanium nitride (TiN). The metal fill 56 can be planarized. The planarizing process can include chemical mechanical polishing (CMP) followed by an etch process. Therefore, the planarization process can be provided by CMP. Other planarization processes can include grinding and polishing.

Consequently, the U-shaped wrap-around-contact 52 can reduce external resistance and improve FET performance. Therefore, contact resistance can be improved. In other words, the exemplary embodiments of the present invention can increase contact area (e.g., contact length) and reduce a contact resistance by employing a wrap-around-contact, even for an extreme scaling of fin pitch (e.g., a fin pitch of less than 50 nm). Therefore, the exemplary embodiments of the present invention provide for a semiconductor device including a wrap-around-contact which can have an improved contact resistance over conventional devices.

FIG. 14 is a cross-sectional view of a semiconductor structure where top source/drain regions are formed over the plurality of fins, in accordance with another embodiment of the present invention.

In another exemplary embodiment, in a structure 5', the top spacer 36 is etched back such that top spacer portions 36' remain over the top surfaces 23, 25 of the high-k material 22 and the WFM layer 24, respectively. Top source/drain regions 42 are then formed over the exposed top fin portions. Sacrificial liner 38 remains between the top source/drain regions 42 and the first gate encapsulation layer 26.

Figure 15:
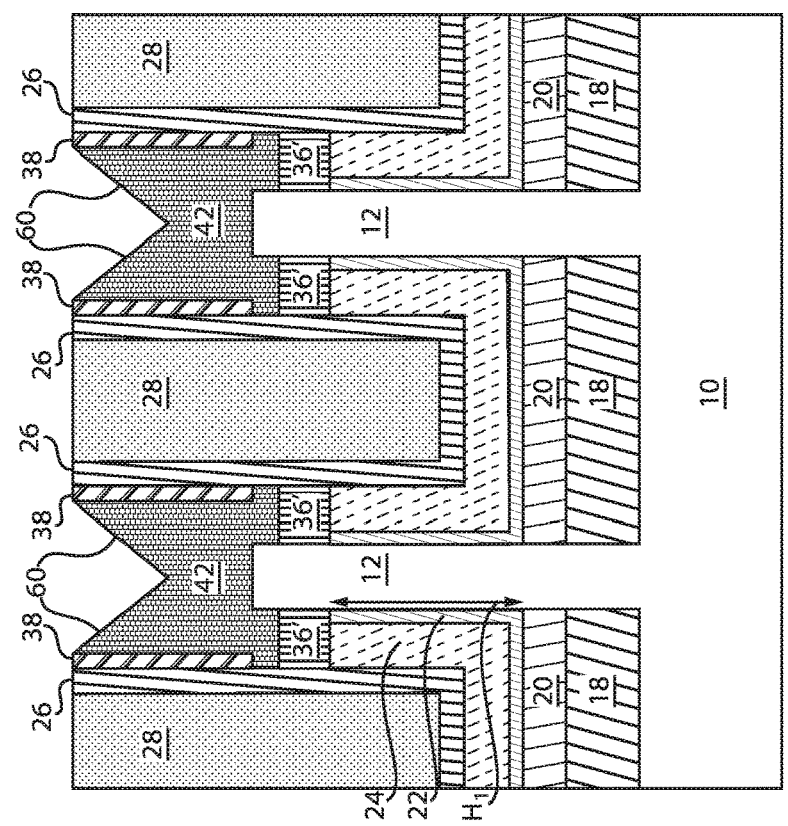
FIG. 15 is a cross-sectional view of a semiconductor structure of FIG. 14 where the top source/drain regions are etched such that V-grooved formations are created, in accordance with an embodiment of the present invention.

FIG. 15 is a cross-sectional view of a semiconductor structure of FIG. 14 where the top source/drain regions are etched such that V-grooved formations are created, in accordance with an embodiment of the present invention.

In various exemplary embodiments, the top source/drain regions 42 are etched such that V-grooved formations 60 are constructed. The V-shaped grooves 60 can provide for a larger contact area for the top source/drain regions 42. The etch can be, e.g., a wet etch. Non-limiting examples of wet etch processes that can be used to form the recess include potassium hydroxide (KOH), ammonium hydroxide (ammonia), tetramethylammonium hydroxide (TMAH), hydrazine, or ethylene diamine pyrocatechol (EDP), or any combination thereof.

Figure 16:
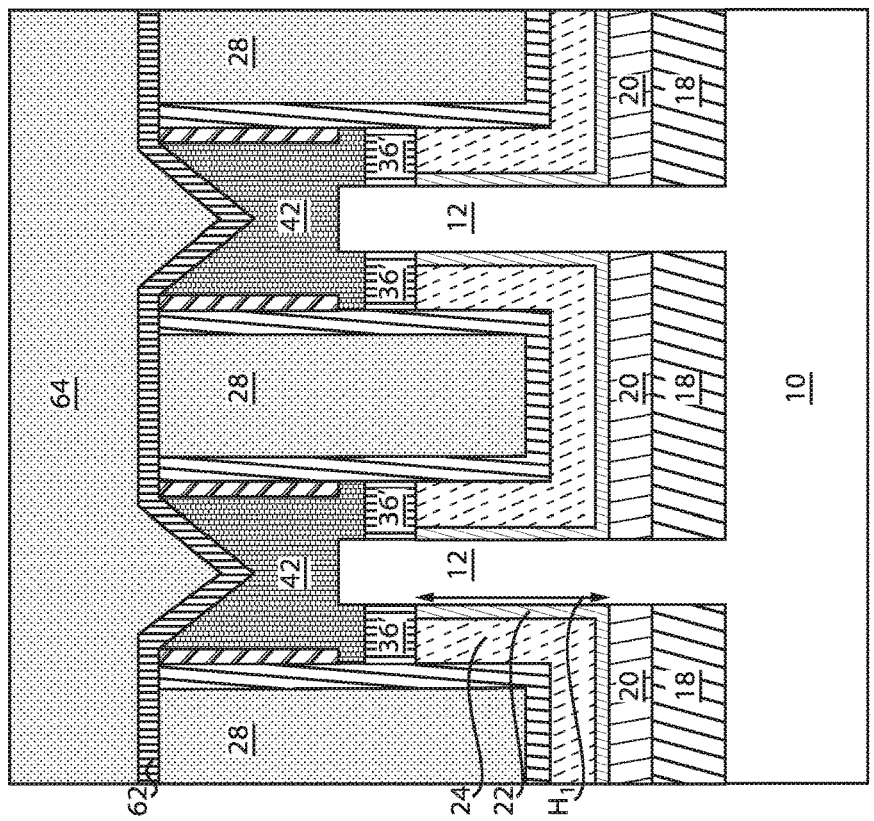
FIG. 16 is a cross-sectional view of a semiconductor structure of FIG. 15 where a dielectric liner and an ILD are deposited, in accordance with an embodiment of the present invention.

FIG. 16 is a cross-sectional view of a semiconductor structure of FIG. 15 where a dielectric liner and an ILD are deposited, in accordance with an embodiment of the present invention.

In various exemplary embodiments, a first dielectric layer 62 and a second dielectric layer 64 are then deposited over the structure. The first dielectric layer 62 can be, e.g., a SiN layer and the second dielectric layer 64 can be, e.g., an interlayer dielectric (ILD).

FIG. 17 is a cross-sectional view of a semiconductor structure of FIG. 16 where the ILD is etched to expose a top surface of the V-grooved formations of the top source/drain regions, in accordance with an embodiment of the present invention.

In various exemplary embodiments, openings 66 are created to the top surface 43' of the top source/drain regions 42. The openings 66 also result in the exposure of the top surface 39 of the sacrificial liner 38.

FIG. 18 is a cross-sectional view of a semiconductor structure of FIG. 17 where the sacrificial liner is removed, in accordance with an embodiment of the present invention.

In various exemplary embodiments, the sacrificial liner 38 is removed, thus creating trenches or openings or cavities 68 extending along the sidewalls of the top source/drain regions 42. The cavities 68 do not extend to the top surface of the top spacer portions 36'. The V-grooved formations 60 remain intact as a result of the removal of the sacrificial liner 38.

Figure 19:
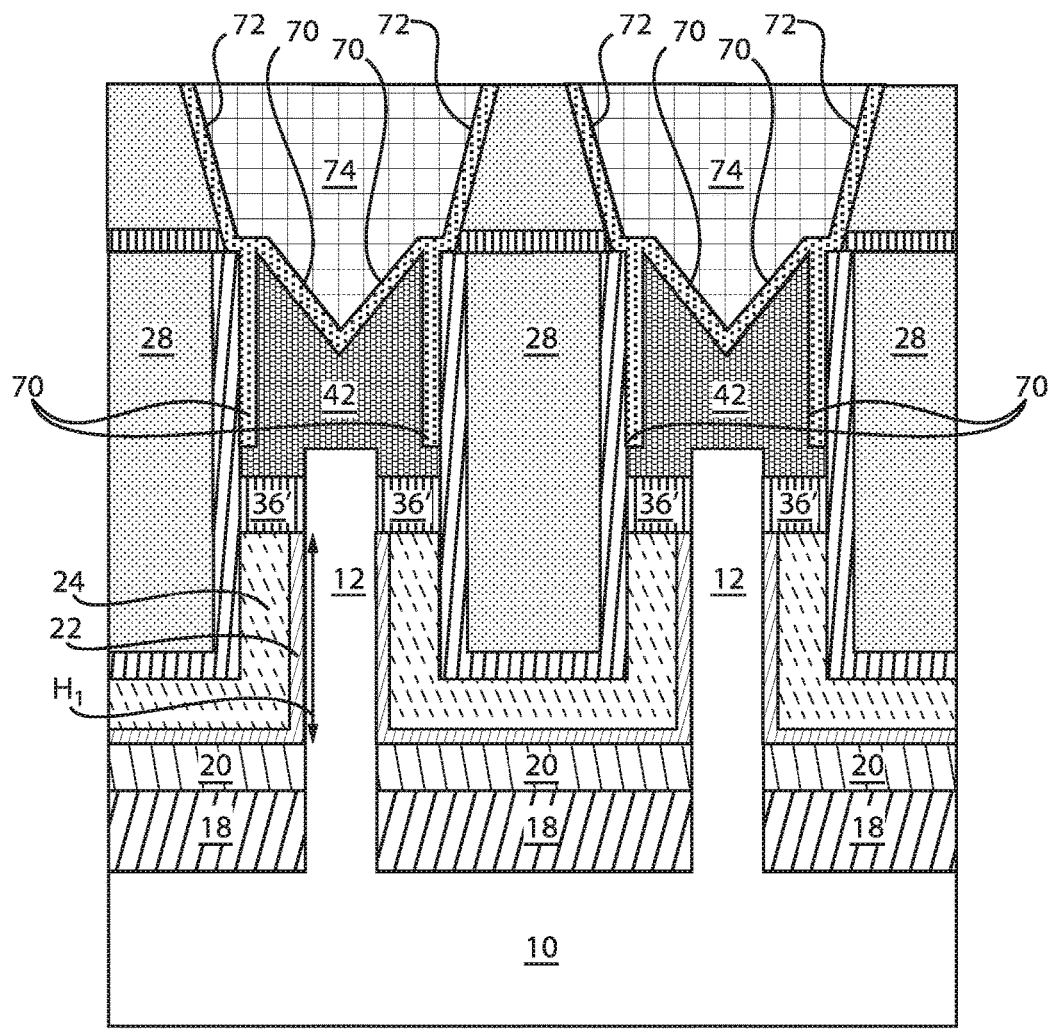
FIG. 19 is a cross-sectional view of a semiconductor structure of FIG. 18 where metallization of the top/source drain regions takes place, in accordance with an embodiment of the present invention.

FIG. 19 is a cross-sectional view of a semiconductor structure of FIG. 18 where metallization of the top/source drain regions takes place, in accordance with an embodiment of the present invention.

In various exemplary embodiments, metallization of the top/source drain regions takes place. The metallization includes forming metal layers 70 and metal layers 72. The metal layers 70 form a substantially M-shaped metal layer over the top/source drain regions 42. The M-shaped metal layer 70 wraps around the top/source drain regions 42. The M-shaped metal layer 70 covers or surrounds or encapsulates or engulfs or encompasses or encloses a substantial portion of an upper area of the top/source drain regions 42. The M-shaped metal layer 70 extends to a level or plane that is flush with the top surface of the fin 12. Additionally, metal layers 72 can be formed adjacent the second dielectric layer 46. The metal layers 72 and the bottom metal layer 70 (V-shape) can work in conjunction to receive a metal fill 74. In one exemplary embodiment, the metal layers 70, 72 can be, e.g., titanium/titanium nitride (Ti/TiN) layers or liners. The metal layers 70, 72 can be deposited by, e.g., an ALD process. The metal layers 70, 72 can be referred to as thin silicide metal liners.

The metal fill 74 can be, e.g., tungsten (W) or cobalt (Co) with silicide metal liner such as titanium (Ti) and titanium nitride (TiN). The metal fill 74 can be planarized. The planarizing process can include chemical mechanical polishing (CMP) followed by an etch process. Thus, the planarization process can be provided by CMP. Other planarization processes can include grinding and polishing.

Consequently, the M-shaped wrap-around-contact 70 can reduce external resistance and improve FET performance. Therefore, contact resistance can be improved. In other words, the exemplary embodiments of the present invention can increase contact area (e.g., contact length) and reduce a contact resistance by employing a wrap-around-contact, even for an extreme scaling of fin pitch (e.g., a fin pitch of less than 50 nm). Therefore, the exemplary embodiments of the present invention provide for a semiconductor device including a wrap-around-contact which can have an improved contact resistance over conventional devices.

Regarding FIGS. 1-19, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming a wrap-around-contact structure for top source/drain in vertical FETs (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a wrap-around-contact, the method comprising:
   forming a bottom source/drain region adjacent a plurality of fins;
   disposing encapsulation layers over the plurality of fins;
   recessing at least one of the encapsulation layers to expose top portions of the plurality of fins;
   forming top spacers adjacent the top portions of the plurality of fins;
   disposing a sacrificial liner adjacent the encapsulation layers;
   recessing the top spacers;
   forming top source/drain regions over the top portions of the plurality of fins;
   removing the sacrificial liner to create trenches adjacent the top source/drain regions; and
   depositing a metal liner within the trenches and over the top source/drain regions such that the wrap-around-contact is defined to cover an upper area of the top source/drain regions.

2. The method of claim 1, further comprising depositing a high-k layer and a work function metal (WFM) layer over the plurality of fins before disposing the encapsulation layers.

3. The method of claim 2, further comprising forming a bottom spacer over the bottom source/drain region before deposition of the high-k layer and the WFM layer.

4. The method of claim 1, wherein the wrap-around-contact defines a substantially inverted U-shaped configuration.

5. The method of claim 1, wherein the encapsulation layers include a first encapsulation layer and a second encapsulation layer.

6. The method of claim 1, wherein the recessing of the top spacers creates cavities underneath the sacrificial liner.

7. The method of claim 5, wherein the top source/drain regions extend into the cavities formed underneath the sacrificial liner.

8. The method of claim 1, wherein the metal liner is a thin silicide metal liner.

9. A method for forming a wrap-around-contact, the method comprising:
   forming a bottom source/drain region adjacent a plurality of fins;
   depositing a high-k layer and a work function metal (WFM) layer over the plurality of fins;
   disposing encapsulation layers over the WFM layer;
   recessing the encapsulation layers to expose top portions of the plurality of fins;
   forming top spacers adjacent the top portions of the plurality of fins;
   disposing a sacrificial liner adjacent the encapsulation layers;
   recessing the top spacers;

forming top source/drain regions over the top portions of the plurality of fins;

forming V-shaped grooves in the top source/drain regions;

removing the sacrificial liner to create trenches adjacent the top source/drain regions; and depositing a metal liner within the trenches and over the V-shaped grooves of the top source/drain regions such that the wrap-around-contact is defined to cover an upper area of the top source/drain regions.

10. The method of claim 9, further comprising forming a bottom spacer over the bottom source/drain region before deposition of the high-k layer and the WFM layer.

11. The method of claim 9, wherein the wrap-around-contact defines a substantially M-shaped configuration.

12. The method of claim 9, wherein the encapsulation layers include a first encapsulation layer and a second encapsulation layer.

13. The method of claim 9, wherein the recessing of the top spacers creates cavities underneath the sacrificial liner.

14. The method of claim 13, wherein the top source/drain regions extend into the cavities formed underneath the sacrificial liner.

15. The method of claim 9, wherein the metal liner is a thin silicide metal liner.

* * * * *